United States Patent [19]

Maloney

[11] Patent Number: 5,530,612

[45] Date of Patent: Jun. 25, 1996

[54] ELECTROSTATIC DISCHARGE PROTECTION CIRCUITS USING BIASED AND TERMINATED PNP TRANSISTOR CHAINS

[75] Inventor: Timothy J. Maloney, Palo Alto, Calif.

[73] Assignee: Intel Corporation, Santa Clara, Calif.

[21] Appl. No.: 218,747

[22] Filed: Mar. 28, 1994

[51] Int. Cl.⁶ ........................................ H02H 3/00
[52] U.S. Cl. ........................... 361/56; 361/91; 361/118
[58] Field of Search ............................... 361/56, 58, 91, 361/118, 127, 111

[56] References Cited

U.S. PATENT DOCUMENTS

| | | | |
|---|---|---|---|
| 3,573,550 | 4/1971 | Baker | 361/91 |
| 3,943,427 | 3/1976 | Tolstov et al. | 361/91 |
| 4,585,905 | 4/1986 | Brown | 361/91 |
| 5,311,391 | 5/1994 | Dungan et al. | 361/56 |

FOREIGN PATENT DOCUMENTS

| | | | |
|---|---|---|---|
| 0296675A2 | 6/1988 | European Pat. Off. | H01L 27/06 |
| 2234126 | 7/1990 | United Kingdom | H02H 9/04 |

Primary Examiner—Jeffrey A. Gaffin
Assistant Examiner—Stephen W. Jackson
Attorney, Agent, or Firm—Blakely, Sokoloff, Taylor & Zafman

[57] ABSTRACT

In device requiring ESD protection, a bias network is used to augment the diode string to distribute small but significant forward current to the diodes. Also employed is the use of cantilever diodes which provide PNP Darlington gain block for ESD protection rather than for amplifying signals in bipolar ICs. In one embodiment, the termination is the principal element of device novelty and that which makes the protection device "stand-alone". The termination supplies final base current to the gain block for a limited amount of time, so that ESD charge can be shunted harmlessly through the PNP chain, but assures that the structure draws no current from a stable power supply long term. The entire structure is able to absorb noise spikes as well as ESD pulses. The termination also makes provisions for discharging its capacitor between ESD pulses, as is necessary for standardized testing. The invention has value as an IC power supply clamp, and reduces the damage often seen on IC power supplies during extensive ESD testing.

23 Claims, 10 Drawing Sheets

5,530,612

ELECTROSTATIC DISCHARGE PROTECTION CIRCUITS USING BIASED AND TERMINATED PNP TRANSISTOR CHAINS

FIELD OF THE INVENTION

The present invention relates to the field of electrostatic discharge protection circuits. More particularly, the present invention relates to electrostatic discharge devices for providing protection between power supply buses in a CMOS integrated circuit.

BACKGROUND OF THE INVENTION

It has been known for many years that extremely high voltages (e.g. 10,000 volts or greater) can develop in the vicinity of an integrated circuit (IC) due to the build-up of static charge. Electrostatic discharge (ESD) refers to the phenomenon whereby an electrical discharge of high current and short duration is produced at the package nodes of an integrated circuit, as a consequence of static charge build-up on that IC package or on a nearby body such as a human being or an IC handling machine. Electrostatic discharge is a serious problem for semiconductor devices since it has the potential to disable or destroy the entire integrated circuit. Because ESD events occur most often across the silicon circuits attached to the package nodes, circuit designers have concentrated their efforts on developing adequate protection mechanisms for these sensitive circuits. Ideally, an ESD protection device should be able to protect an IC against any conceivable static discharge by passing large currents in a short time in a nondestructive manner.

One difficulty in designing ESD circuits is the demanding performance requirements which must be met. For example, one of the primary industry standards for measuring ESD robustness— MIL-STD-883C method 3015.7 Notice 8 (1989) and its follow-on standard no. 5.1 (1993) from the EOS/ESD Association—requires ESD "zapping" for what can be a large number of pin and power supply combinations. In the past, ESD protection circuits have had difficulty in meeting these stringent military standard performance requirements while maintaining adequate noise immunity.

Integrated circuits have come under pressure in these human body model (HBM) ESD tests because of repeated stressing of the power supply rails, leading to wearout of various breakdown points on, say, the Vcc lines. A reliable power supply clamp device is needed in order to take pressure off the rest of the Vcc bus during ESD stressing.

As will be seen, the present invention provides an ESD protection circuit which exceeds industry performance goals while allowing adequate noise immunity margins and product compatibility through the use of multiple power supplies.

Co-pending application Ser. No. 08/138,472 filed Oct. 15, 1993 relates to devices for protecting an integrated circuit (IC) against electrostatic discharge (ESD). The basic design of one device described in the co-pending application is capable of being implemented for a variety of different circuit protection requirements. For instance, in one embodiment the disclosed device can be used for protecting an input buffer only against an ESD event. In another embodiment, an output buffer of an integrated circuit can be protected and still in yet another embodiment, the ESD protection circuit can be utilized to protect a terminal of an integrated circuit which is capable of both receiving inputs and providing outputs as an external signal.

In each instance, the device disclosed in the aforesaid co-pending application includes as a key feature, a self-triggered silicon controlled rectifier (SCR) which is preferably coupled across the internal supply potentials of the integrated circuit. When the SCR has its anode coupled to a first supply potential and its cathode coupled to a second internal supply potential, the SCR exhibits a snap-back in its current versus voltage characteristic which is triggered at a predetermined voltage during an ESD event. As large voltages build up across the chip capacitance, the predetermined voltage of the SCR is triggered at a potential which is sufficiently low to protect the internal junctions of the IC from destructive reverse breakdown. At the point it triggers, the SCR provides a low resistance path between the first and second supply potentials.

In one embodiment, the SCR comprises a pnpn semiconductor structure which includes a n-well disposed in a p-substrate. A first n+ region and a p-type region are both disposed in the n-well. The n+ and p-type regions are spaced apart and electrically connected to form the anode of the SCR. Also included is a second n+ region. However, there are triggering difficulties which arise from the use of a SCR as a power supply clamp due to several reasons. First, there is a minimum SCR trigger voltage which is near the n+ junction breakdown voltage on the rest of the power bus, meaning that ESD current will usually be shared with other circuits on the power bus. Also, each SCR clamp has a minimum trigger current for the low voltage state. Thus, the power bus can become "hung up" near the (higher) trigger voltage due to the SCR's failure to reach the low voltage state, resulting in current sharing with the entire power bus.

In addition to the use of a SCR as a power supply clamp to provide ESD protection, over the past few years, it has become common to include diode strings, especially across power supplies, as part of routine ESD protection in products such as the 80486SL (Enhanced) microprocessor manufactured by Intel Corporation.

Diode strings have been used successfully to couple peripheral power supplies to their corresponding core power supplies during ESD events, while affording voltage isolation adequate to prevent unwanted coupling during ordinary operation. In their role as "charge couplers," they have enhanced charged device model (CDM) performance. More visibly, there is growing evidence that they help products with multiple, electrically separated power supplies to pass the multiple pin combination tests of the HBM ESD test, the most common industry standard test. Conversely, most products with multiple, electrically separated power supplies that have not, for one reason or another, used the diode strings have had difficulty passing the HBM pin combination tests. In these cases, failures have often been elusive, seeming to occur at random due to "wearout" of peripheral power buses. Better power supply clamping and better coupling of the charge to "safe" discharge paths seems to be needed. The following is an explanation of how the diode strings accomplish this and how certain enhancements can be used to expand and improve ESD protection.

A typical example of a diode string would be a Vsso (e.g., a noisy output supply) double-clamped to core, or substrate, Vss, as shown in FIG. 1a. The single diode is, of course, the n+ junction on the p-substrate, while the stack of four is a diode string cell. Also shown in FIG. 1b is a typical diode string between Vcco and a core Vcc. Notice that the Vsso-Vss arrangement is bidirectional (because of the parasitic diode), while the Vcco-Vcc coupling is unidirectional.

Diode string layout begins with a subcell, resembling the diode shown in a schematic top view in FIG. 2. The basic p-n junction is made with tightly spaced, minimum width p-diffusions and n+ taps of floating n-wells. A parallel combination of these cells forms a diode with the desired area, measured by taking account of the total length of metal-contacted p+ fingers opposite metal contacted n+ tap fingers. In this way, current density is measured in current per micron. Next, diodes are connected in series as shown in cross-section in FIG. 3. Each n-well is tapped and fed to the p+ junction of the next diode. Any number of p-n junctions can be strung together in this way (although there is a point of diminishing returns, as discussed below); for the purpose of this description, the 4-stage case, which is a common choice, is shown and described.

In FIG. 3, the floating wells also form an unavoidable rectifying junction with the substrate, with the result that the "diode string" is really a chain of Darlington-coupled PNP transistors, schematically shown in FIG. 4. This raises the question of the influence of the vertical current gain (β) on diode string operation, which can be considerable. Indeed, it will be shown that the current gain can be used to formulate designs with improved efficiency and versatility. But first the p-n diode equations and temperature dependence need to be developed.

Basic diode behavior in terms of temperature dependence and current vs. voltage relationship will now be described to provide a further background necessary for an understanding of the present invention.

a. Temperature dependence

Starting with the p-n junction I-V relation:

$$I=Is \ (\exp(qV/nkT)-1), \text{ where } Is=Io \exp \ (-Eg(T)/kT), \quad \text{[Eq. 1]}$$

where n is the diode ideality factor (almost 1), Eg(T) the bandgap, T the absolute temperature, k is Boltzmann's constant and q the electronic charge. The $-1$ term can be ignored as long as $V>3kT/q$, about 100 mV for a typical product temperature range. Any temperature dependence in Io is outweighed by the temperature dependence of the exponential factor that follows. Therefore, Eq. 1 can be written:

$$\ln(I/Io)=(qV-nEg(T))/nkT, \quad \text{[Eq. 2]}$$

and be assured that this quantity is nearly independent of temperature for a constant current I. In a typical product temperature range of interest (−55 C to 125 C), the silicon bandgap has been measured to be Eg(T)=Ego−bT, where Ego=1.206 eV and b=2.7325×10⁻⁴ eV/K as described by Y. P. Tsividis, "Accurate Analysis of Temperature Effects in Ic-Vbe Characteristics with Application to Bandgap Reference Sources", IEEE J. Solid State Circuits, SC-15, 1076–1084 (1980).

Ignoring a slight second order temperature correction that applies only below room temperature, Ego is therefore the extrapolated 0K bandgap and will henceforth be expressed in volts. Notice that if Eq. 2 is expanded out, the linear coefficient b contributes nothing to the temperature dependence of the right hand side, so another temperature-independent quantity is (qV−nEgo)/nkT.

This means that if the diode forward voltage Vf at absolute temperature T0 is known, the voltage at the same forward current can be easily calculated for another temperature $T_1$:

$$Vf(T_1)=nEgo+(T_1/T0) \ (Vf(T0)-nEgo) \quad \text{[Eq. 3]}$$

The temperature coefficient of Vf will thus be negative; typically T0 is room temperature and Vf is around 0.55–0.6 V for forward current of 1–10 μA, giving a temperature coefficient for Vf around −2.2 mV/K.

b. Current vs. voltage

Diode ideality factor can be measured from a semilog plot of diode I vs. V, most conveniently done on an HP4145 Semiconductor Parameter Analyzer. An ideal diode (n=1) gives the well-known 60 mV/decade slope for low currents at room temperature (0.060 V≈300 k ln(10)/q).

Once the single diode ideality factor is determined, the semilog I–V slope of a diode string is of interest. For a series of m diodes, it can be shown that the low current I–V slope is mnkT ln(10)/q volts per decade, or m×60 mV/decade for ideal diodes at room temperature. This result holds even with finite PNP current gain β, as long as β is independent of current. As described below, the bipolar current gain just amplifies the current passed at a given voltage, in a manner depending only on β itself.

Modeling the effect of transistor action, namely current gain and modeling in the leakage regime and in the ESD regime provides further useful insights into a proper understanding of the invention.

Current gain and modeling in the leakage regime

For an analysis of the effect of the PNP bipolar current gain, or β, on the performance of the diode string, a single stage of the Darlington-coupled series is shown in FIG. 5, with the usual relations shown for emitter, base, and collector currents:

Because the next diode stage has reduced current flowing into its emitter, the forward voltage in stage 2 will be reduced by an amount depending on β:

$$\ln(I_1/Is)=qV1/nkT; \ \ln(I_2/Is)=qV2/nkT=\ln \ (I_1/((β+1)Is))=\ln(I_1/Is)-\ln(β+1), \text{ so that} \quad \text{[Eqs. 4]}$$

$$V2=V1-(nkT/q) \ \ln(β+1), \text{ or } V2=V1-\ln(10) \ (nkT/q) \log(β+1).$$

Now let Vo=ln(10)(nkT/q), 60 mV for an ideal diode at room T. The analysis of Eqs. 4 is applied to multiple stages to give a loss of an additional Vo*log(β+1) at each stage, resulting in a total voltage $V_t$ of a string of m identical diodes at current $I_1$ of $$V_t = mV_i - V0\log(β + 1) \left( \frac{m(m-1)}{2} \right) \quad \text{[Eq. 5]}$$

where $V_1$ is the base-emitter voltage for one diode (collector and base shorted) at emitter current $I_1$. Obviously this model depends on a constant β and no effect of series resistance, which are usually the case in the low leakage current range. The effect of temperature on diode string efficiency is clearly shown in FIG. 6 which plots out Eq. 5 for two temperatures.

Given some baseline diode data like ideality factor and forward voltage for a given current at a reference temperature (such as room T), the $V_1$ at the temperature of interest can be calculated, and Eq. 5 applied. Equation 5, and the summation leading up to it, shows that a sizable β results in a decreasing additional voltage for each succeeding diode stage, the reason being that the final stage has less and less emitter current, resulting in less and less voltage drop for that stage. The model breaks down when that voltage is so low that the −1 term in Eq. 1 becomes substantial again and the voltage of each additional stage goes to zero. Never does an additional diode actually subtract from Vt.

Current gain and modeling in the ESD regime

When an ESD pulse passes through the diode/transistors, the current density is many decades higher than in the leakage regime discussed above. There are not just microamps of leakage, but milliamps per micron of p+ finger length in the initial diode stage. In this regime, diode resistance effects become important, and current gain decreases.

The expected functional form of $\beta$ plotted against current density is shown in FIG. 7. When log $\beta$ is plotted versus log Je, the emitter current density, a linear declining slope results also. This also simplifies the modeling. The decline of $\beta$ with collector current density is expected in all bipolar transistors (See, W. M. Webster, "On the Variation of Junction-Transistor Current Amplification Factor with Emitter Current", Proc IRE 42, 914 (1954), quoted in S. M. Sze, *Physics of Semiconductor Devices,* 2nd edition (Wiley, 1981), pp. 142–143). The result is that there is high $\beta$ at low current, where it is undesired due to diode leakage, and low $\beta$ at high current, where $\beta$ allows ESD current to pass to the substrate. Nevertheless, with clever use of the design options, a competitive protection device can be devised within the available area.

BRIEF SUMMARY OF THE INVENTION

The present invention is an improvement to the ESD protection described in co-pending application Ser. No. 08/138,472 filed Oct. 15, 1993.

It is well known that electrostatic discharge (ESD) can irreparably damage an integrated circuit. Integrated circuits are designed to operate using a relatively low voltage supply, typically 2.5–5 V. The damage occurs when a high potential is applied to an input or output buffer of the integrated circuit which may occur by a person simply touching a package pin which is in electrical contact with an input or output buffer of the integrated circuit.

Although numerous circuits exist which provide ESD protection, as new integrated circuit processes are utilized, new measures frequently need to be employed to provide ESD protection since use of standard cells which individually had been qualified to very high ESD test voltages in the human body model (HBM) do not provide sufficient protection, resulting in integrated circuit failure. A common theme in these failures has been separation of Vcc power supply buses in, say, an SQFP package, and resulting Vcc leakage failure after testing of the many required pin combinations. Sometimes the failure can be avoided with test partitioning, i.e., spreading the many required "zaps" over a number of components in accordance with the latest industry test standards, but this is effective only about half the time.

What is needed is a restoration of "modularity" to the standard cell method for ESD cells. When a set of standard input and output devices works well on a test chip, their use in a variety of products must be guaranteed to give similar results. Product ESD performance has been uneven because of the ESD current path from one power supply to another (see FIG. 8), as evidenced by failure analysis and the fact that almost all ESD problems disappear when all the power supplies are artificially shorted together, thus reducing the current path to little more than the standard cell modules themselves. Thus it is clear that an appropriate set of power supply clamping modules could manage that portion of the current path, and be what is needed to enable a product to perform as desired in ESD tests. FIG. 8 shows how power supply coupling facilitates ESD current through the desired current paths.

When used as power supply clamps, input protection devices have triggering difficulties and do not absorb all the ESD current necessary to protect the IC. The bipolar action present in diode strings presently in use has been found to be highly beneficial as a power supply clamp. At present, these diode string devices bridge one power bus to another and can be used only when the two power supplies always track closely enough that cross-coupling is not harmful. This invention extends the usefulness of power supply clamps operating under this bipolar action principle by allowing them to "stand alone", and to clamp certain power supply buses to substrate.

The present invention utilizes as key elements a bias network which is used to augment the diode string to distribute small but significant forward current to the diodes as shown in FIG. 14 or cantilever diodes which provide PNP Darlington gain block as shown in FIG. 19, and the terminations as shown in FIGS. 20a–20c. In the FIG. 14 embodiment, the principal element of novelty is in the use of a multi-stage Darlington transistor for ESD protection rather than for amplifying signals in bipolar ICs. In the FIG. 19 embodiment, the termination is the principal element of device novelty and that which makes the protection device "stand-alone". The termination supplies final base current to the gain block for a limited amount of time (dependent on the RC time constant of the p-gate pull-up), so that ESD charge can be shunted harmlessly through the PNP chain, but assures that the structure draws no current from a stable power supply long term. The entire structure is able to absorb noise spikes as well as ESD pulses. The termination also makes provisions for discharging its capacitor between ESD pulses, as is necessary for standardized testing.

The invention has value as an IC power supply clamp, and reduces the damage often seen on IC power supplies during extensive ESD testing, Present-day devices are stressed many hundreds or even thousands of times in the industry standard human body model (HBM) of ESD, owing to pin count and multiple power supply lines. There is already evidence to suggest that PNP chain devices, of the kind discussed here, are essential for first-time success in product ESD testing, and that they make it possible for the HBM tests to be passed with just a few component samples. This greatly simplifies the ESD qualification process.

BRIEF DESCRIPTION OF THE DRAWINGS

The present invention will be understood more fully from the detailed description that follows and from the accompanying drawings. The drawings, however, should not be taken to limit the invention to the specific embodiments shown, but are for explanation and understanding only. For example, the relative layer thicknesses shown in the drawings should not be construed as representing actual thicknesses.

DETAILED DESCRIPTION OF THE INVENTION

A robust electrostatic discharge (ESD) protection circuit for use in CMOS, and particularly n-well, p-substrate CMOS, integrated circuits is described. In the following description, numerous specific details are set forth such as circuit configurations, conductivity types, currents, voltages, etc., in order to provide a thorough understanding of the present invention. It will be obvious, however, to one skilled in the art that these specific details may not be needed to practice the present invention. In other instances, well-known circuit elements and structures have not been described in particular detail in order to avoid unnecessarily obscuring the present invention.

Figure 9:
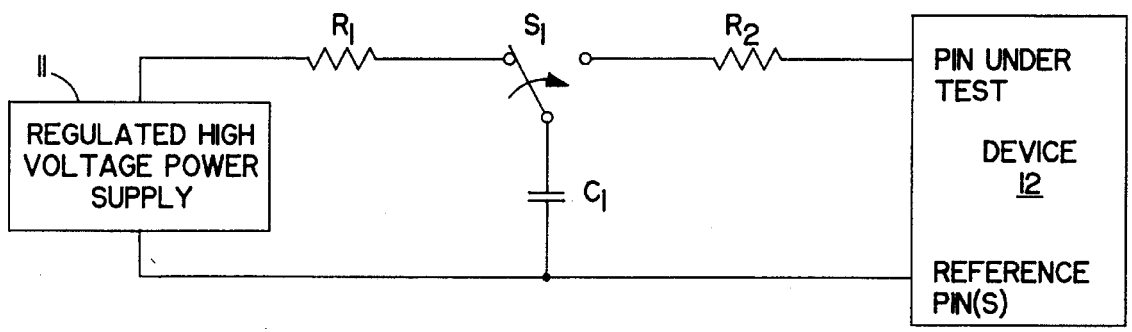
FIG. 9 illustrates a MIL-STD 883C, Method 3015.7, Notice 8 electrostatic discharge testing circuit.

FIG. 9 illustrates the Human Body Model (HBM) pulse test used to satisfy MIL-STD-883C Method 3015.7, Notice 8. According to this test, a device 12 is coupled to a regulated high voltage power supply 11 through a network comprising resistors $R_1$, $R_2$, switch $S_1$, and capacitor $C_1$. The discharge pulse or "zap" is generated by capacitor $C_1$, which has a capacitance of 100 picofarads; charged to several thousand volts through resistor $R_1$. Resistor $R_1$ has a value of between 1 and 10 Mohms.

In performing the test, capacitor $C_1$ is first adequately charged through $R_1$; then relay $S_1$ is switched so that capacitor $C_1$ is coupled to device 12 through resistor $R_2$. The potential on capacitor $C_1$ is then discharged through resistor $R_2$ (1.5 Kohm) to the pin being tested. The MIL-STD requires that the zap be delivered three times positively and three times negatively for all possible discharge combinations. These combinations are as follows:

1. All signal pins with respect to each separate power supply grounded.
2. All supply pins with respect to each other, each with separate power supply grounded.
3. All signal pins with respect to all other signal pins grounded.

Figure 10:
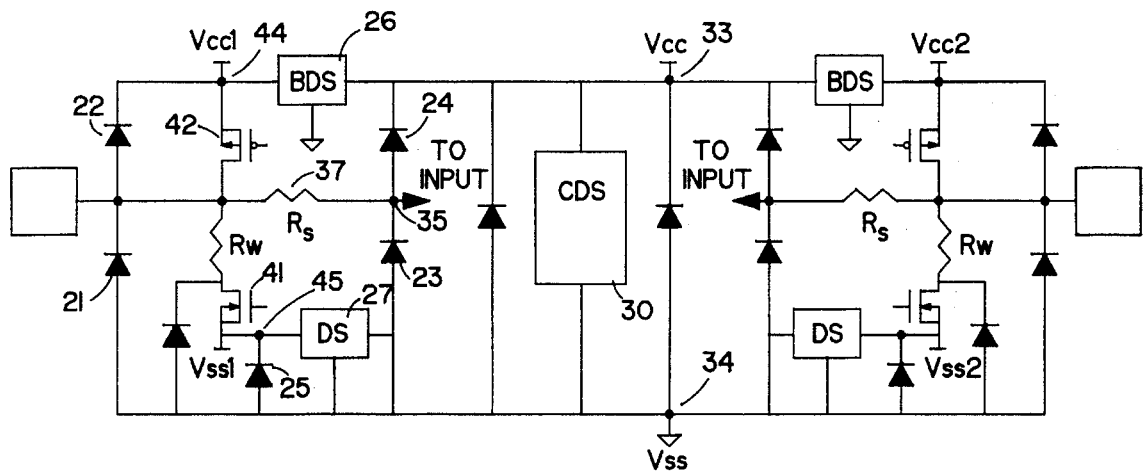
FIG. 10(a) is a circuit schematic diagram of the electrostatic discharge protection circuit of the present invention with biased diode string and cantilevered diode string.
FIG. 10(b) is a circuit schematic diagram of a generalized electrostatic discharge protection circuit according to the present invention.
Figure 10:
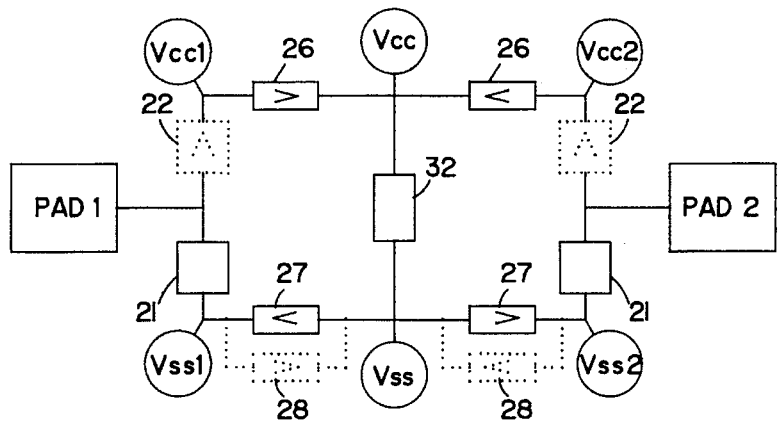

With reference now to FIG. 10(a), there is shown a circuit schematic diagram of the ESD protection circuit of the present invention utilizing both bias diode strings (BDS) and a cantilevered diode string (CDS). In the most general case, the circuit of FIG. 10(a) is utilized to provide ESD protection at an input/output (I/O) buffer, and utilizes separated $V_{cc}$ and $V_{ss}$ power supplies. The separated power supplies are represented as $V_{cc1}$ and $V_{ss1}$ denoting power supplies for the periphery, as opposed to the internal circuitry. It should be understood that the circuit of FIG. 10(a) is advantageously formed in the same silicon substrate which forms the integrated circuit to be protected. Thus, the invented ESD protection circuit is easily fabricated as part of a normal integrated circuit manufacturing process.

The key circuit elements used in protecting a typical I/O pin will now be described in further detail. These circuit elements comprise a combination of discrete devices and parasitic structures.

One of the first things to note about the ESD protection circuit of FIG. 10(a) is that it employs separated power supplies. For example, the peripheral power supplies $V_{cc1}$ and $V_{ss1}$ are coupled to nodes 44 and 45, respectively, whereas the internal power supplies $V_{cc}$ and $V_{ss}$ are coupled to respective nodes 33 and 34. Each of the peripheral power supplies is coupled to its corresponding internal power supply through a diode clamp. By way of example, bias diode string (BDS) 26 connects node 44 to node 33, whereas diode string (DS) 27 connects node 45 to node 34. Note that the buffer circuitry which ordinarily forms part of the input/output circuitry of the IC is shown in FIG. 10(a) by the combination of PMOS transistor 42 and NMOS transistor 41. Transistors 41 and 42 are coupled in series between nodes 45 and 44.

Practitioners in the art will appreciate that in the present invention, the input/output buffer circuitry shown in FIG. 10(a) is coupled to the peripheral power supplies. This means that any noise generated by the I/O devices is effectively isolated from the internal supply lines of the IC. Diode strings 26 and 27 each operates as a diode clamp to maintain a separation between the noisy peripheral supply lines and the internal power supplies. The diode clamping mechanism also provides the lowest possible impedance path between the chip's peripheral and core power supplies. Diodes strings 26 and 27 may comprise one or more diodes in series, depending upon the level of noise isolation which is desired between the two supplies. As an example, if it is desired to provide at least 2.0 volts of noise isolation between $V_{ccp}$ and $V_{cc}$, then diode string 26 should comprise at least four diodes coupled in series.

Figure 11:
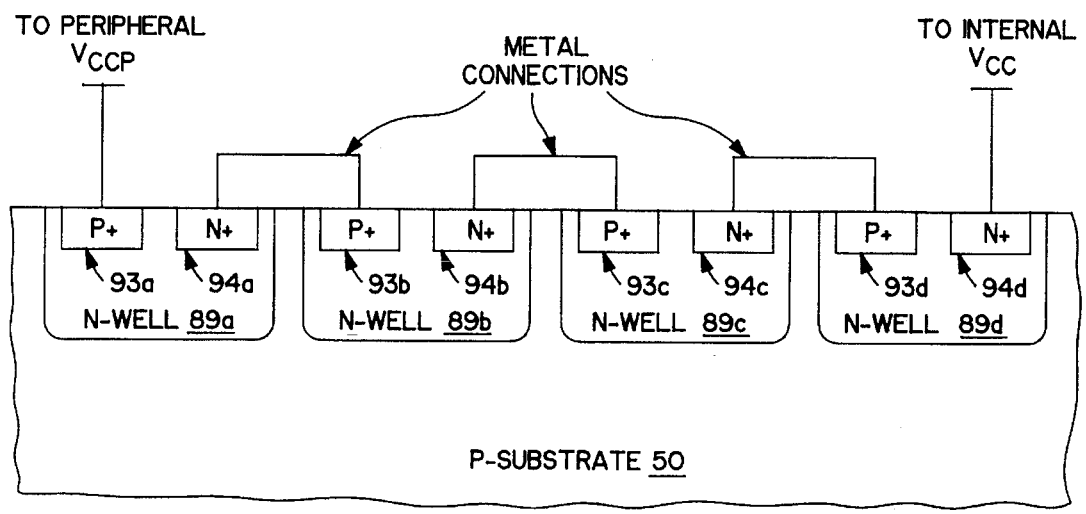
FIG. 11 is a cross-sectional view of the diode power supply clamp similar to FIG. 3 utilized in one embodiment of the present invention.

FIG. 11 is a cross-sectional view of a diode clamp structure, which is made up of four diodes coupled in series. The diode is shown consisting of a set of separate structures disposed in substrate 50. Each structure includes both p+ and n+ diffusions (93 and 94, respectively) disposed in a floating n-well 89. Each of the four separate n-well regions 89a–89d are formed in p-type substrate 50. By way of example, the first diode in the series comprises diffusion regions 93a and 94a, with p+ diffusion region 93a being coupled to the peripheral power supply $V_{ccp}$.

Figure 1:
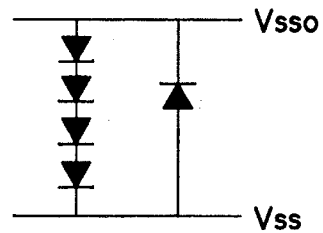
FIGS. 1a and 1b are a schematic of typical diode strings between peripheral and core power supplies.
Figure 1:
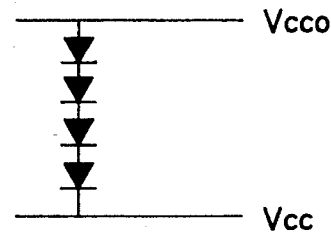
Figure 2:
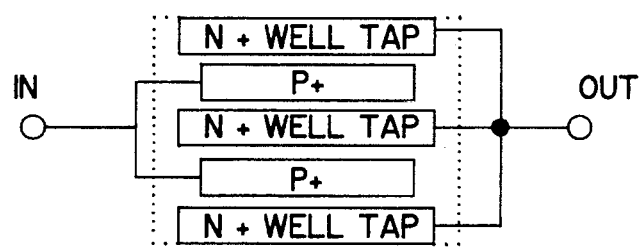
FIG. 2 is a representative top view of diode subcell layout.
Figure 3:
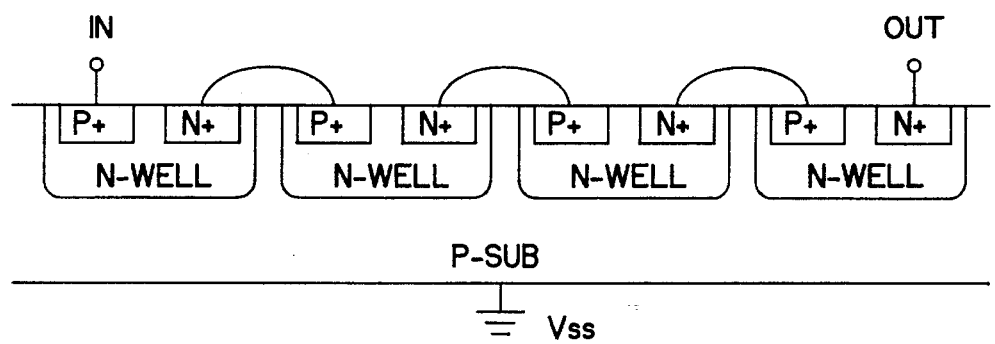
FIG. 3 is a cross-sectional view of 4-stage diode string in p-substrate CMOS.

The series connection of separate diodes which comprise the diode clamp may be coupled together using any available metal layer. The metal connections are always from the n+ region of the previous diode stage to the p+ region of the next stage; that is, n+ region 94a is coupled to p+ region 93b, n+ region 94b is coupled to p+ region 93c, and so on. At the cathode terminal of the diode clamp, n+ region 94d is coupled to the internal power supply $V_{cc}$. Note that the power supply diode string 27 can be implemented using the same floating n-well concept shown in FIGS. 3 and 11. For diode 27, however, the p+ side is connected to the peripheral $V_{ssp}$ supply and the n+ side of the diode is connected to internal $V_{ss}$. Note that diode strings 26 and 27 are designed to provide a current path during an electrostatic discharge event.

Some of the key elements in the ESD protection circuit of FIG. 10(a) are the use of diode biasing, tapering, and cantilevered diodes.

Operation of the cantilevered diode string 30 functions to shunt any destructive current away from the internal chip capacitance, thereby protecting the core of the IC.

With continuing reference to FIG. 10(a), the connection between the pad and the input gate is made via the local input gate clamp network comprising resistors $R_s$ (labeled as resistor 37) and diodes 23 and 24. A typical value for resistor 37 is on the order of 100 ohms. In most cases, diodes 23 and 24 are optimally located adjacent to the input gate circuitry to maintain a low voltage near the gate. The local input gate clamp acts as a voltage dropping network, clamping the gate voltage of the input side of the I/O buffer to an acceptable level. By way of example, this level may represent the gate dielectric breakdown voltage of an input or output buffer. In one embodiment, resistor 37 comprises an ordinary polysilicon resistor. Further note that diodes 23 and 24 are usually small in size (e.g., 30 microns wide) and may be constructed with the same diode cells used to build diode strings 26 and 27.

One of the problems with prior art designs which include salicided diffusions is the problem of damage to the transistor devices associated with the I/O buffer. Because salicidation essentially removes the normal resistance associated with the drain diffusion, current spreading is no longer present in these technologies and damage can occur at both the source and drain regions.

With reference again to FIG. 10(a), the remaining circuit elements not yet discussed include diodes 21, 22 and 25. Diode 22 is coupled between the pad and node 44 and operates to shunt current to power supply $V_{ccp}$ when the pad or pin is zapped positively. Diode 22 is preferably located adjacent to transistor 42 in order to minimize the resistance between the anode of diode 22 and the drain of transistor 42. Similarly, diode 21 is shown coupled between the pad and node 34. Diode 21 is inherent in the layout of the output buffer and guards against an ESD event whenever the pad is zapped negatively with respect to $V_{ss}$. Diode 25 is also inherent in the layout of the output buffer and is connected between $V_{ss}$ and $V_{ssp}$. Both of diodes 21 and 25 comprise large, vertical diodes formed between the n-channel drain/source transistor regions and the p-substrate.

Figure 12:
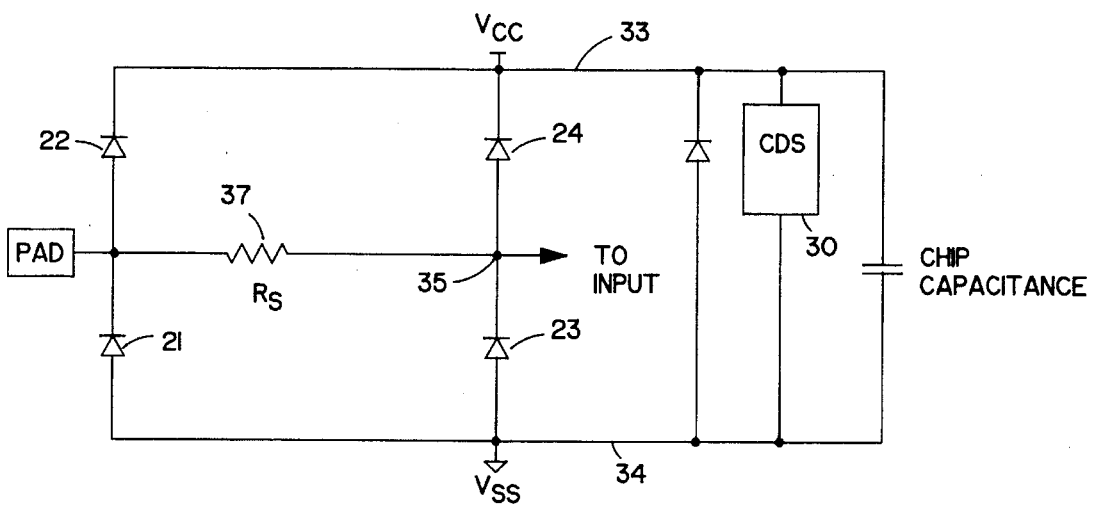
FIG. 12 is a circuit schematic diagram of another embodiment of the invention which provides ESD protection for an input only pin.

FIG. 12 illustrates an alternative embodiment of the ESD protection circuit of the present invention for a typical input-only pin. Without the presence of output transistors 41 and 42, the circuit of FIG. 12 is simplified considerably. Note that the same basic structure of FIG. 11 is preserved in the embodiment of FIG. 12, except that transistors 41, 42 and associated resistor 38 and diode 25, are not included. Also, since the circuit of FIG. 12 is designed to handle input-only signals, there is no need for separate power supplies and clamping diodes 26 and 27. Input pins are usually tied to the internal power supplies making the special ESD power supply diode clamps unnecessary. In all other respects, the circuit of FIG. 12 is the same as that described above for FIG. 11. Practitioners in the art will appreciate that removal of the MOS output drivers eliminates the fragile thin gates and thus decreases the cell capacitance.

Figure 8:
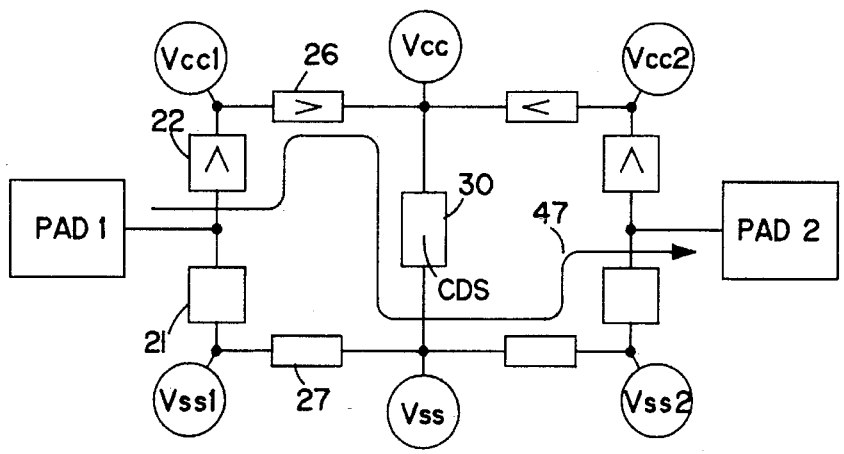
FIG. 8 illustrates the preferred ESD current path through the circuit of the present invention during a positive electrostatic discharge event from pad 1 to pad 2.
Figure 13:
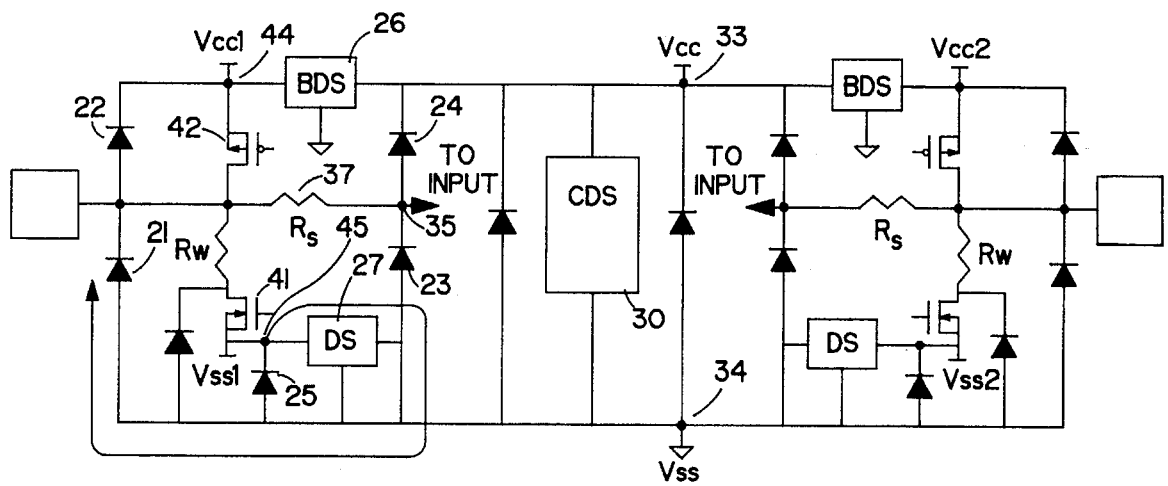
FIG. 13 illustrates the current path through the circuit of the present invention during a negative electrostatic discharge event with respect to peripheral $V_{ss}$.

FIGS. 8 and 13 are presented as examples to further explain how the present invention functions during an ESD event. FIG. 8 illustrates the current path through the circuit of FIG. 10(a) during a positive ESD zap from pad 1 to pad 2. FIG. 13, on the other hand, illustrates the current path during a negative ESD zap with respect to peripheral $V_{ssp}$.

Applying this theory to the I/O ESD protection circuit of FIG. 10(a), one can easily identify where the current flows during an ESD event. For example, in FIG. 8, arrow 47 highlights the current path taken during an ESD event when the pin is zapped positively from pad 1 to pad 2. In this case, diode 22 and bias diode string 26 are turned on, shunting the current to the core and charging the chip capacitor to $V_{ss}$. This large capacitor (around 10,000 picofarads for a microprocessor) and the cantilever diode string 30 dissipates most of the ESD charge and energy. As the ESD zap voltage increases the resulting $V_{cc}$–$V_{ss}$ potential approaches 12–13 volts, where current is shared through breakdown of internal circuitry. But properly applied cantilever diode clamps relieve the stress on the internal circuitry and allow current sharing to occur only at very high ESD zap voltages.

FIG. 13 highlights the opposite case where the I/O pin is zapped negatively with respect to the peripheral supply voltage $V_{ssp}$. Here, current flows from peripheral $V_{ss1}$, through the diode clamp 27 to $V_{ss}$. Then, the discharge current path continues through the n-channel drain diode 21, and finally out to the pin.

When implementing ESD protection, it should be understood that connectivity plays an important role in the success of the circuit. In the case of the ESD protection circuit of FIG. 10(a), the power supply clamping diode strings 26 and 27, and cantilevered diode string 30 may be located far from the actual I/O buffer they are designed to protect. The circuit current path impedances, however, should be kept to a minimum so that other parasitic paths do not become the preferred discharge path. On the other hand, diodes 23 and 24 are preferably located as close to the input device node 35 as possible in order to minimize voltage drops.

Furthermore, because instantaneous ESD zap currents can easily exceed several amperes and last for several nanoseconds, metal width becomes an important concern. For example, metal extending from the bond pad to the I/O cell at node 35 (called the "leadway metal") can fuse during an ESD event if the metal width is not wide enough. For this reason, the leadway metal should have a width which is sufficient to adequately handle a large discharge event.

FIG. 10(b) illustrates a generalized implementation of the invention where optional or not required elements are shown in dotted lines. The pads may or may not have p-channel devices 22 to peripheral power supplies Vcc1 and Vcc2, but if so they have the direction shown in FIG. 10(b). Similarly, the only peripheral power supply Vss1 or Vss2 power supply to internal power supply Vss devices which are always present are the natural well to substrate diodes 27. However, the (unbiased) diode chains 28 from Vss1 or Vss2 to Vss are optional. The novel aspects of the present invention are shown in FIG. 10(b) are the clamp 32 from Vcc to Vss, which may be a cantilever diode or biased diode chain, and the biased diode strings 26 from Vcc1 and Vcc2 to Vcc. It should be noted that the devices 21 without an arrow are bidirectional in terms of their ability to pass ESD current.

Behavior of diode strings for electrostatic discharge (ESD) protection, made from floating n-wells in p-substrate CMOS, is described in the leakage current regime as well as the ESD current regime. Bipolar PNP action accounts for unwanted low-voltage conduction as well as for very desirable clamping of power supply overvoltages.

As previously noted, the invention is a circuit to improve electrostatic discharge (ESD) protection in integrated circuits (IC). The circuit utilizes devices which are primarily intended to provide ESD protection between power supply buses on a CMOS (primarily n-well, p-substrate CMOS) integrated circuit. The invention employs certain design enhancements for exploiting $\beta$ and limiting its unwanted effects, by diode biasing, tapering and cantilevered diodes and for enhancing $\beta$ with a PPN cell.

Exploiting $\beta$ and limiting its unwanted effects

As noted above, there are the following effects of PNP current gain on the performance of diode strings:

a) The low-current $\beta$ is a not desirable because it cuts the turn-on voltage of the chain.

b) The high-current $\beta$ is of great benefit because it turns the diode string into a very effective power supply clamp to substrate Vss, surpassing its role as a mere conduit for charge to another power bus.

Although $\beta$ is unfortunately higher at low currents, there still are ways to use $\beta$ for ESD clamping while minimizing its effect on diode string performance in the leakage regime. The following is an outline of these techniques, the goal of which is to eliminate the unwanted effects of $\beta$ without compromising ESD performance.

i. Diode tapering

Equation 5 specifies the total diode string voltage Vt for a set of identical diodes. However, the area (i.e., p+ finger length) of succeeding diode/PNP stages might change. Suppose the area of each succeeding PNP stage of a diode string shrinks by exactly a factor of $(\beta+1)$. Then the current density at each diode is exactly the same, and the full voltage of $mV_1$ is achieved across the chain. Equation 5 can be seen as a special case of the equation $$Vt = mVf - Vo \left( \sum_{i=2}^{m} (\log (L_i(\beta_{i-1} + 1)^{m-i+1}) \right) \quad \text{[Eq 6]}$$

where $L_i$ is the finger length (diode area) of the ith stage relative to the first stage, i.e., $L_1=1$. The second term will therefore vanish, or at least be reduced, if the diode/PNP chain is tapered to some extent, in accordance with the expected value of $\beta$. A properly tapered diode string not only removes the isolation voltage problem associated with $\beta$, it uses less area.

However, it should be noted that diode conductance is limited, so the ESD current regime demands diodes of a certain size. Even if the chain is tapered with an eye on the high current $\beta$ (which is low), similar resistance drops will exist in each diode, which may or may not be acceptable.

ii. Bias Networks

Figure 6:
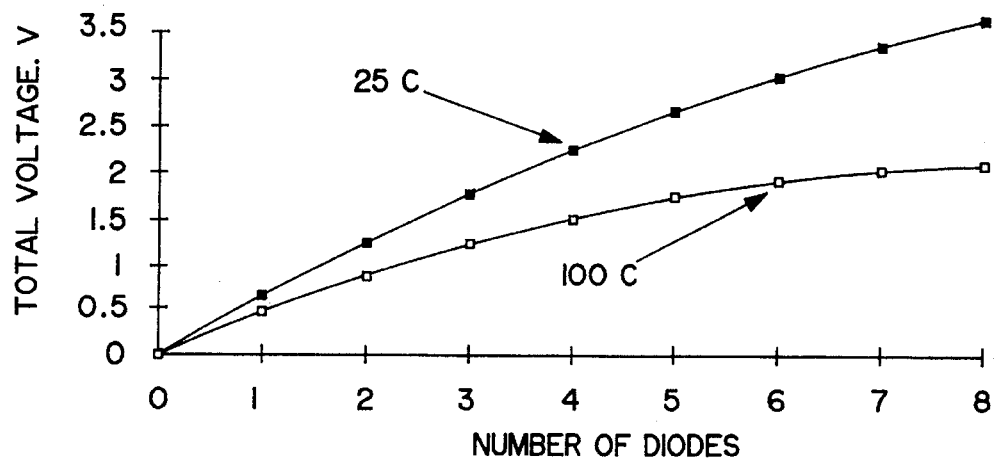
FIG. 6 is a graph plotting diode string turn-on voltage for two temperatures for $\beta$=6.
Figure 7:
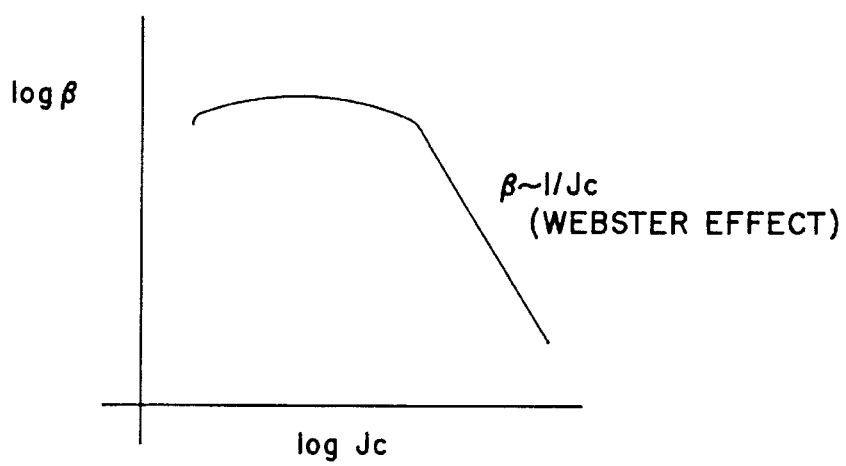
FIG. 7 is a graph showing the log of current gain plotted against the log of collector current density for a typical diode string PNP transistor.

The reason for the declining incremental voltage across the diode string is, of course, lower current density in the latter stages, due to current flow to ground. Boosting current density in the latter stages so that the total desired voltage drop is partitioned more or less equally among the available stages is therefore a worthy goal. Tapering accomplishes this but the main problem with tapering is that using this method to minimize leakage in a diode string is not compatible with maximizing ESD performance, as discussed above. But there is another method to lift the sagging curves of FIG. 6 without affecting ESD performance at all, by augmenting the diode string with a bias network to distribute small but significant forward current to the diodes. The resulting diode string is sometimes said to be cladded, and the string called cladded diodes for convenience. A network of the sort pictured in FIG. 14 allows the diodes to be biased, in segments of one or more diodes, so that the achievable voltage across the string is a multiple of the voltage across the segment. The leakage current requirement is then relatively constant over a wide temperature range.

Figure 14:
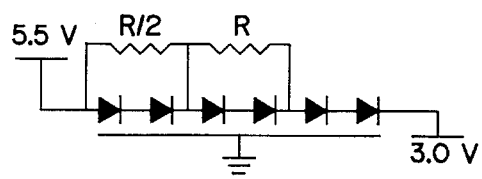
FIG. 14 is a bias network for a 6-diode mixed power supply clamping string, designed to maximize the temperature at which leakage current of $\Delta V/R=2.5/R$ flows, while using minimum total resistance.

FIG. 14 shows a biased diode string with the extremes of 3.3–5 V mixed power supplies applied. The usual chain of PNP transistors is shown as diodes with a distributed ground as the common collector. In this case, the design choices for a bias network are driven by a desire to minimize the area used, which means minimizing the total resistance involved, as well as the total number of resistors. The most efficient choice for a resistor is the long-channel PMOS device. In order to achieve the desired 2.5 V across the string in FIG. 14 at a given temperature (say, 100 C), it is necessary to determine what current Io is required by two PNP diode/transistors biased at $\Delta V/3=2.5/3=0.833$ V at that high target temperature. Then R is chosen so that Io flows through each pair of diodes, i.e., $\Delta V/3R=2.5/3R=Io$ and $2.5/R=3Io$ is the total leakage. This works as follows: 2Io flows through the first resistor, then Io is shunted to the second diode pair (assume infinite PNP gain in worst case, so that there is no diode current left after each segment), and the same voltage drop IoR develops across the second resistor. Finally the precalculated Io flows through the last two diodes. Thus the total current through the diode string is $3Io=\Delta V/R$ or less (here $\Delta V=5.5$ V$-3.0$ V$=2.5$ V), as long as Io into one segment produces at least $\Delta V/3$. This will be generalized below.

This simplified view is a worst-case design method, one that assumes $\beta$ is large and that the amount of current passed on to the next diode segment is negligible, which is not always the case. More complete modeling can give an exact answer, but finite $\beta$ will only improve diode string leakage performance.

Notice how the diode strings in ESD mode are unaffected by introducing bias resistors, which are so large they always pass very low current. It is important to assure that the resistive devices have no easily activated parasitic breakdown modes, but the diode string's ability to clamp at low voltages makes this possible.

Figure 15:
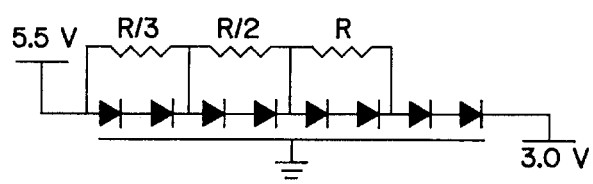
FIG. 15 is a bias network for an 8-diode mixed power supply clamping string, designed with the same goals as the network in FIG. 14.

Now to approach a generalization of the method by examining an 8-diode string, which would allow even more isolation (less current) between the power supplies at high temperatures, it is attractive to have 4 segments of 2 diodes apiece, as shown in FIG. 15.

Again the (simplified) total current is $\Delta V/R$, but this is now $4Io$, where Io into a segment produces $\Delta V/4$, or 2.5/4 volts in this case. The pattern developing is clear; for equipartition of voltage into n equal segments of a diode string, the resistor sequence is $$\frac{R}{n-1}, \frac{R}{n-2}, \frac{R}{n-3}, \ldots, \frac{R}{3}, \frac{R}{2}, R$$

starting from the positive end of the string. Total current In will not exceed $\Delta V/R$ as long as forcing Io (=In/n) through a segment produces at least $\Delta V/n$ volts. The resistor sequence, starting from the right, follows what mathematicians call the harmonic series:

$$1, \frac{1}{2}, \frac{1}{3}, \frac{1}{4}, \frac{1}{5} \ldots$$

The resistor cladding strategy can be likened to a highway proceeding out from a city which is at first 3 lanes, then two, then one lane in a given direction. As current units leave to bias the diode segment to the same voltage as the next resistor, the associated "lane" is not needed in the next resistor to establish equal voltage. It is believed that this strategy allows for the lowest total resistance (which translates into p-channel area used) needed to achieve the leakage current and voltage goals at a target temperature, as discussed above. One can easily show that separate resistors to each segment, while effective, use many more ohms (at least a factor of (n−1), n the number of segments) to achieve an equivalent result. It is like building separate highways to several destinations that lie in the same direction.

Some adjustment to the harmonic series values for the resistors must be made if diode tapering is included, because the diode segment voltages ultimately depend on current density. If one looks once again at each bias resistor as being so many conductive "lanes" of current, the conductance of each "lane" must be scaled down to match the scaling of the segment for which its current is intended, if it is desired to preserve equipartition of voltages and minimize total leakage current.

Use of the harmonic series of resistors is based on the assumption that high temperature leakage is a problem and that the temperature at which a certain leakage current goal is achieved needs to be maximized given the voltage target. If there is plenty of extra margin and some stabilization is needed, a different series string could be used. For example, if n times a segment voltage Vo is substantially greater than $\Delta V$ at the target high temperature, then all bias resistors can be set to R and only the last segment will be on. Other segments will be off and $$I_n \approx \frac{\Delta V - V_0}{(n-1)R}$$

This does not maximize the temperature at which In will be achieved, but it could be used to minimize current at the target temperature. The same kind of analysis applies to the low temperature case when the cladded diodes have been designed at the harmonic series limit for high temperature.

Again, all but the last segment will be virtually off. That means that the 6-diode string in FIG. 14 then supports less than two-thirds of $\Delta V$ across the resistors (without biasing the diodes much), totaling 1.5 R, so that total leakage is less than four-ninths $\Delta V/R$, the exact value depending on Vo at the lower temperature. But this is not dramatically lower than the high temperature leakage, showing that the bias network desensitizes the circuit to temperature variations.

Figure 16:
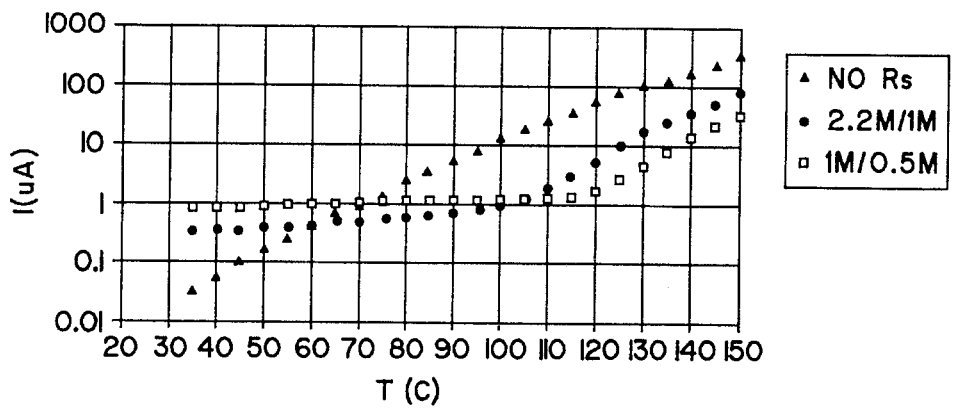
FIG. 16 illustrates measured leakage for 3.0–5.5 V 6-stage cladded diode string, as pictured in FIG. 14. Values were chosen to allow low leakage up to 100 C.

Experimentally, adding resistors to a tappable diode string works just as expected, as shown in FIG. 16.

Figure 17:
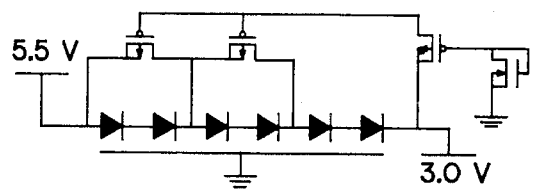
FIG. 17 is a bias network implemented in p-channel FETs for a 6-diode mixed power supply clamping string.

The cladded diode string resistors are implemented with p-channel FETs, as stated earlier. FIG. 17 shows a 6-diode chain where gate oxide voltages greater than 3.6 V are not allowed, thus the p-channel resistor gates are referred to 3 V. This allows more favorable (smaller) size p-channel devices to be used, anyway, because the conductance is lower than if the gates were at 0 V. The resistive connections to 3 V and 0 V prevent unimpeded power supply voltages from appearing across a thin gate oxide. The resistive connection to Vss (ground) is accomplished with an n-channel device; otherwise there would be a power supply voltage across a gate oxide.

The resistive bias network offers another benefit to operation of the Darlington PNP transistor chain, that of supplying leakage current to the floating n-wells (transistor bases) distant from the highest voltage power supply. This is especially important at high temperature. Although n-well leakage is usually no higher than a few 10's of nanoamps even at high operating temperature, it is important to avoid supplying that current to the remote n-wells through several amplifying PNP stages; the total leakage becomes the basic leakage multiplied by several factors of ($\beta$+1). With the configuration of FIG. 17, the floating n-well leakage is fed through at most one PNP stage, so total leakage due to that effect is kept low. Even at room temperature and equal Vcc voltages this issue can become severe when the diodes are exposed to light (particularly a microscope light during failure analysis), because then the n-well "leakage" is a quite considerable photocurrent. A photodarlington effect results and the Vcc-Vss current is huge because the photocurrent has to be supplied through an amplifier. A proper bias network can reduce total current and draw the attention of the failure analyst away from this.

Figure 18:
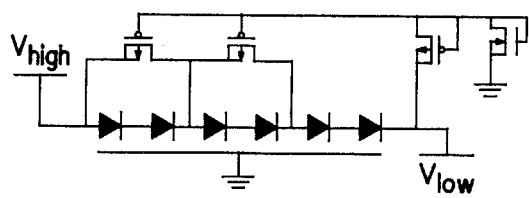
FIG. 18(a) shows alternative p-channel gate placement for a cladded diode string, aimed at limiting amplified n-well leakage due to p-gate turnoff.
FIG. 18(b) shows the concept and one implementation of a buffered voltage divider, aimed at establishing equipartion of voltages and retaining low leakage at low temperature.
FIG. 18(c) shows the concept and one implementation of a buffered voltage divider, aimed at establishing equipartion of voltages and retaining low leakage at low temperature.
Figure 18:
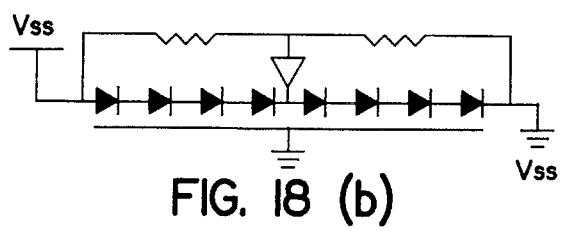
Figure 18:
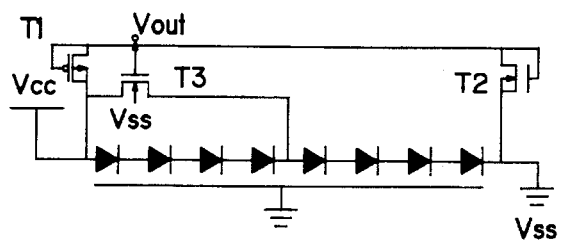

An interesting situation develops when the two power supplies of FIG. 17 are set equal to 3.3 V, which is an option. Then the p-channel bias resistor devices turn off and subthreshold leakage alone (probably inadequate) has to feed the n-wells. The n-wells then self-bias, below 3.3 V, in order to feed leakage to the 5th diode, which acquires a back bias with respect to 3.3 V. But fortunately, sometimes the leakage under such conditions is still less than 100 nA even for eight 152 µm diodes at 100° C., because of the PNP $\beta$ around 3. Processes with higher $\beta$ (e.g., 7) and thinner oxide can avoid the p-channel turnoff problem because the full 5.5 V is allowed to appear across the thin oxide, meaning that the p-gates can be at 0 V. In a conceivable future process with high-$\beta$ PNP devices and gate oxide voltage restricted to low values, the configuration of FIG. 17 will have to be adjusted to provide some limitation on the leakage-induced voltage drops in the string. FIG. 18a shows a scheme which prevents excessive amplified leakage (including photocurrent) when $V_{high}=V_{low}$, by redesigning the n-FET to form a long channel "leaker pair", establishing a voltage below $V_{low}$ for the p-resistor gates so that they never turn off, yet still never suffer dielectric breakdown. The leaker pair can be designed to require minimal leakage from $V_{low}$.

It should be noted that the voltage applied across the biased diode string may not always be from two Vccx supplies on a mixed power supply chip. It could also be between a Vcc and a Vss, for example, with core Vcc being the most likely choice. As technology advances and ICs run at lower and lower voltages, with correspondingly lower burn-in voltage, this kind of power supply clamp is a distinct possibility. A chain of 8 diodes, for example, can be arranged to clamp a 2.5–3 V supply with low leakage, and also survive 3–3.6 V burn-in to high temperatures (125–150 C), at least with the rather low PNP beta values seen in advanced technologies.

With such a long diode chain sustaining its largest differential voltage at burn-in (at which temperatures the pnp beta goes up), some method of pumping extra current into intermediate stages may still be desired. But the current replenishment at high temperatures and burn-in voltage could severely compromise the product performance at lower temperature and lower voltage unless some improvement is made to the biasing schemes discussed thus far.

FIG. 18b shows the concept of a buffered voltage divider being used to establish equipartion of voltage down the string. This practice could apply to any biased diode string, and the buffering could be applied to any number of intermediate stages in the chain. Vcc-Vss clamps are a prime candidate because there is always a substantial differential voltage across the chain. One would like the standby leakage current through the divider to be small, and for the amplifier to supply little current from Vcc unless needed, e.g., at high temperatures. This would then lower the leakage current as shown in FIG. 16 at all temperatures, at the cost of a little extra circuitry. FIG. 18c shows how such a scheme might be implemented in CMOS circuitry.

The leaker pair T1 and T2 are always on, but as very long channel devices, they do not draw significant Icc. When the node following the fourth diode falls a threshold below Vout, as at high temperatures, the source follower T3 (a stronger device, capable of many microamps of current) turns on until the lower part of the chain is replenished adequately. But T3 is off completely or sourcing very small currents at lower temperatures, where Vcc is easily supported at low currents. The body effect in T3 affects its trip point, but the leaker pair can often be designed with that in mind.

The novelty of the above concepts for biasing a PNP transistor chain is considerable. ESD protection as well as temperature-dependent voltage-current goals are all met and made possible only by using the biasing schemes as discussed. While the Darlington transistor is not new, the prior art concerning those devices is not with ESD protection but with the two-stage Darlington used for amplifying signals in bipolar ICs {e.g., P. Horowitz and W. Hill, The Art of Electronics, 2nd edition (Cambridge University Press, 1989), pp. 94–95. and P. Gray and R. Meyer, Analysis and Design of Analog Integrated Circuits, 3rd edition (Wiley, 1993), p. 223}. In this case, bias resistors (between the emitter of the first transistor and the base of the second) are placed primarily to speed up the device, and incidentally to avoid amplified leakage current. The term "bias network" was adapted from that literature and was chosen as a concise description of some of the novel circuits discussed herein. There is no known precedent for the multi-stage Darlington configuration discussed herein (which would be slow and disadvantageous for signal switching), nor of the ESD protection application for the multi-stage Darlington.

iii. Cantilevered diodes

Figure 4:
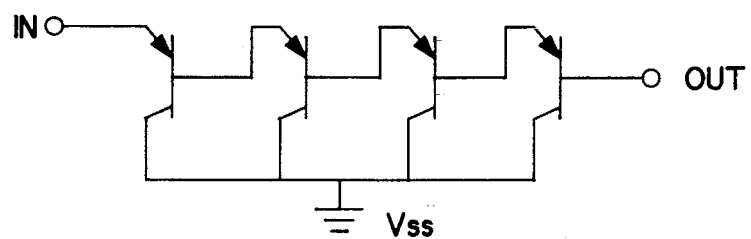
FIG. 4 is a four-stage diode string of FIG. 3, seen as a chain of PNP transistors.
Figure 5:
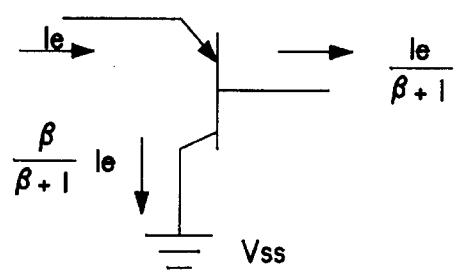
FIG. 5 illustrates current gain effects in the bipolar transistor formed by a diode stage.

Diode tapering recognizes that less and less current is required by each succeeding stage of the diode/PNP chain. This fact is useful in other ways. Referring to the PNP chain shown in FIG. 4, because of the current gain at each stage, the current at the output is a factor of $(\beta+1)^4$ less than the input current. Thus even for a fairly low $\beta$, the majority of the current flows to the substrate. For a modest $\beta$, even one less than 10, the base current required at the output is low enough that alternatives to attaching the output to another power supply can be considered. Some kind of small circuit may be sufficient, and would free the user from assuring that the two power supplies always track within the voltage limits. The concept of not having a power supply anchorage at the far end of the diode chain has come to be known as cantilevered, or cantilever, diodes. It can be combined with diode tapering and bias networks to produce more efficient, more versatile diode string designs.

A simple capacitor at the output might be a sufficient termination for cantilever diodes, but it must be reset after every pulse or it will charge up and turn off the diode string. This is because of the repeated pulses of the HBM test, where power supplies are (directly or indirectly) stressed seconds apart for hundreds or thousands of times. A capacitor may need a small pull-up diode to the input in order to discharge within one second; well leakage could be insufficient.

It has been determined that the architectural advantages of cantilever diodes are considerable. Even if 3.0–5.5 V power supply differences can be withstood by a well-designed diode/PNP string at all temperatures, power-up sequencing options may prevent it from being used in a given product. Also, without a stand-alone diode scheme there is (almost) no way to use diode strings to protect core Vcc. A sufficiently large peripheral Vcc would allow a diode string in the reverse direction to use it as a termination; due to $\beta$, most current goes to the substrate and the peripheral Vcc is not threatened. While core Vcc is usually the best Vcc on the chip and very ESD-tolerant, this is not always the case as noted by C. Duvvury, R. N. Rountree, and O. Adams, "Internal Chip ESD Phenomena Beyond the Protection Circuit", Proceedings of the IEEE International Reliability Physics Symposium, 1988, pp. 19–25. A good core power supply clamp could forgive the kind of obscure weaknesses discussed by C. Duvvury et al. and C. C. Johnson, S. Qawami, and T. J. Maloney, "Two Unusual Failure Mechanisms on a Mature CMOS Process", 1993 EOS/ESD Symposium Proceedings, pp. 225–231.

Figure 19:
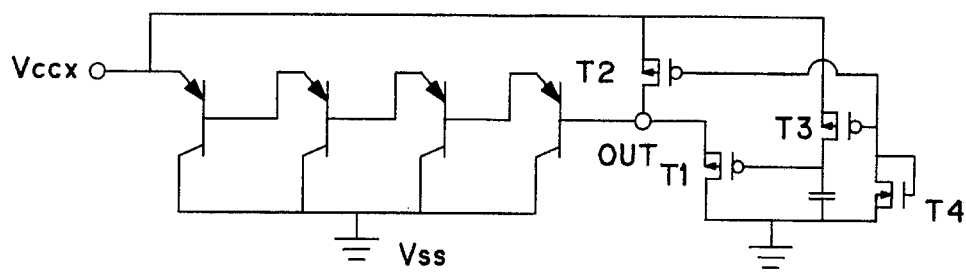
FIG. 19 shows the key elements utilized by the present invention, specifically cantilever diodes which provide a PNP Darlington gain block.

A cantilevered diode termination that sinks a substantial amount of base current over the time of an ESD pulse, but which turns itself off long term, is shown in FIG. 19. Four stages are shown, but more can be added. Base current, up to several mA, is sunk through the p-FET (T1), whose gate is initially grounded because of the capacitor. The thin oxide capacitor is about 1 pF and is pulled up by a long-channel p-FET (T3) with an equivalent resistance in the megaohm range, to give an RC time constant of a microsecond or more. T2 is another long-channel device which supplies leakage current to the end of the string, avoiding the amplified leakage problem. T2 could be accompanied by additional resistive devices connecting to the middle of the diode string, as described in the previous section. T4 is a small nFET which grounds the gates of T2 and T3. After the RC-induced time delay, T1 turns off and there is no long-term conduction to ground. T3's p-diode to the input assures that the capacitor voltage does not go higher than the input, as it would with repeated pulses if there were no such diode. The circuit thus relaxes after each pulse due to leakage on Vccx.

Figure 20:
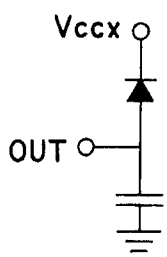
FIGS. 20(a)–20(e) show various terminations which may be used with the cantilever diode string used in the present invention.
Figure 20:
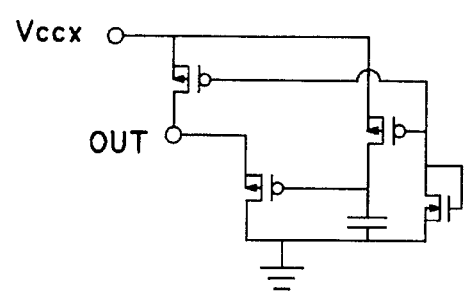
Figure 20:
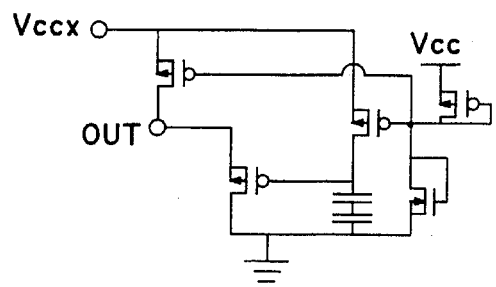
Figure 20:
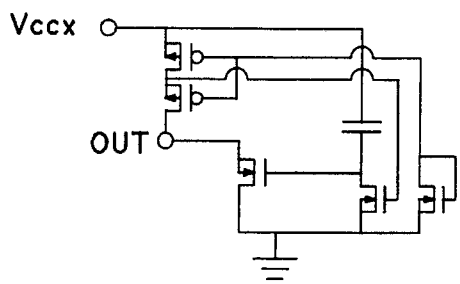
Figure 20:
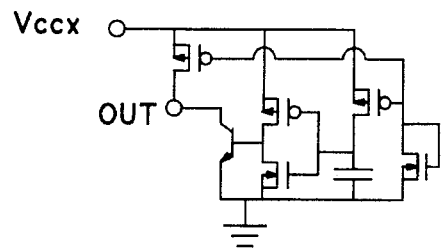

Various alternative cantilever diode terminations are shown in FIGS. 20(a)–20(e). The simple capacitor (with pull-up diode for charge relaxation) is shown in FIG. 20(a), while the circuit of FIG. 19 is shown in FIG. 20(*b*). It will be described below how to make the capacitor's resistive pullup FET smaller by connecting it to a lower voltage than Vccx. But the configurations shown in FIG. 20(*b*) is not allowed in processes where Vccx is taken to 5 V nominal, because of gate dielectric breakdown in the long-channel p-FETs with grounded gates. The configuration in FIG. 20(*c*) is analogous to FIG. 19, because it uses the leaker pair to establish the desired p-FET gate voltage below Vcc (core Vcc is restricted to 3.3 V nominal). Now all the FET gate voltages are legal but Vccx is across the T1 p-FET's gate to drain and also across the capacitor, both elements not in FIG. 19. The capacitor thus cannot be a single thin gate oxide; two such devices in series are probably the best implementation and are shown in FIG. 20(*c*). The capacitor, usually made with poly gate on substrate or n-well, would be two such devices in series, with the poly gate as the common terminal so that unequal leakage is avoided and the voltage is truly split between the capacitors. Unfortunately, the usual practice of forming an accumulation capacitor (poly gate on grounded n-well) does not work for both devices in this "back to back" scheme, with the result that at least one inversion device must be used. The T1 p-FET does not have 5 V between gate and well but does have static 5 V across the edge between gate and drain. This may or may not be allowed by dielectric breakdown rules; if not then a stacked replacement for T1 also is needed. Because of these complexities, the preferred way to protect a high voltage Vccx with certain processes is to use the biased diode string to core Vcc, as in the bias networks discussed above.

FIG. 20(*d*) shows a way to implement the cantilevered termination with n-channel devices. While the capacitor to Vcc cannot be an accumulation capacitor in p-substrate/n-well CMOS, there are advantages to the n-channel implementation such as having greater conductance per unit length in the large termination device.

Finally, FIG. 20(*e*) shows a bipolar NPN termination, which can be very efficient in a BiCMOS process. Bipolar transistors of this kind have high gain and high conductance per unit area, and can be expected to clamp voltage at a few tenths of a volt (saturation) instead of suffering the square-law turn on voltage of a FET. However, in this case, the usual RC circuit on Vcc needs to be buffered as shown to allow sufficient base current into the bipolar transistor.

Figure 21:
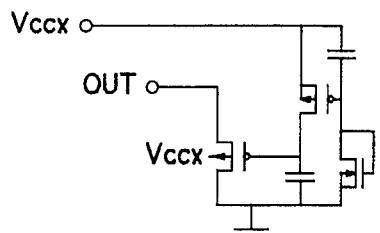
FIG. 21 shows a two-stage RC delay circuit.

One other noteworthy cantilever diode termination that appears to work well is shown in FIG. 21 which has two stages of RC delay and is used to terminate a 6-stage tapered diode string.

Figure 22:
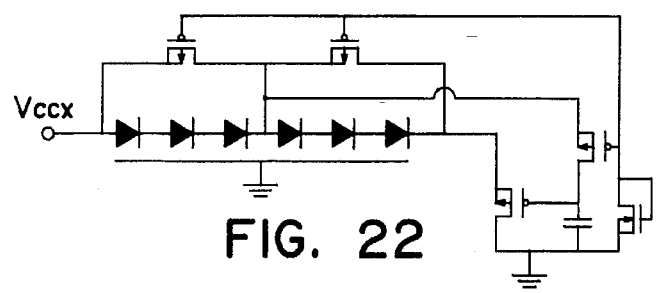
FIG. 22 shows a six-stage cantilevered diode string with resistive bias network and termination circuit resembling FIG. 20(b).

The original 6-stage FIG. 22 cantilever diode could have used a bias network, or at least the kind of long-channel p-FET to Vccx shown in FIG. 19, which bootstraps the OUT node to Vccx and supplies needed leakage current at high temperature. With a low current $\beta$ of over 30 (higher at high temperature) and subthreshold leakage from the p-FET in the 10s of nanoamps, a version of the device self-heated into thermal runaway at 125° C. ambient and burned itself out. This was an undesired tribute to the tremendous amplifying power of the PNP transistor chain. By simply installing the bias network and preventing amplified leakage current, excessive leakage and thermal runaway can be avoided. FIG. 22 is an example of a six stage cantilevered diode string with bias network and termination circuit. The capacitor pullup goes to a higher voltage than OUT to be sure it is activated, but the voltage is below Vccx as shown so that the total gate voltage is lower and the FET resistance is high.

It should also be noted that when using cantilever diode termination circuits a few design ideas to be avoided are shown in FIGS. 23*a*–23*d*. Use of a long channel n-FET as a pull-up as in FIG. 23(*a*) would appear to be attractive if the |Vt| of the n-FET is less than that of the short-channel p-FET, which is often the case even when body effect is considered for the n-FET. In practice there is a problem, seen on test structures. The capacitor acquires charge, and voltage, immediately when Vccx is pulsed, apparently due to the startup transient on the n-FET. Electrons flow into the source from the capacitor node to fill the channel. Thus it is advisable to keep the sources (whether p or n) attached to power supplies.

Figure 23:
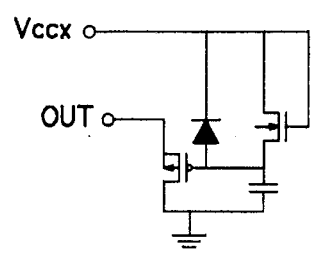
FIGS. 23a–23d show flawed cantilever diode termination circuits.
Figure 23:
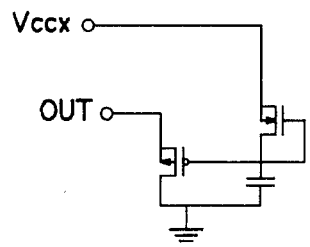
Figure 23:
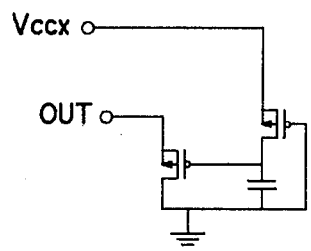
Figure 23:
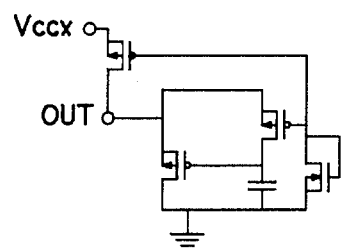

The circuit in FIG. 23(*b*) is not advisable because the long-channel p-FET feeding the capacitor and short channel p-FET gate gets stuck one VT below Vccx and may not allow the short channel p-FET to turn off, which is required in steady state. The capacitor's resistive pull-up is more stable with a ground on the long channel p-FET gate as in FIG. 20(*c*), but the hard ground of FIG. 23(*c*) should be avoided because there is only a small thin oxide edge between Vccx and ground. This oxide may survive all CDM ESD events due to what is in parallel with it, but those parallel elements cannot be guaranteed. Finally the circuit shown in FIG. 23(*d*) can get stuck at a few hundred mV on the terminating short-channel p-FET when that FET's channel current is supplied by the bias resistors and the gate voltage somehow goes below ground, turning on the device. This has been seen to happen in room lights when a depletion capacitor is on the gate. The light is believed to drive the n-type poly capacitor plate below ground, while the long channel p-FET is subthreshold and cannot pull up the capacitor node to turn off the channel. Taking the long-channel p-FET to a manifestly higher voltage (as in FIGS. 19 and 22) is preferred; channel current fed through the bias resistor automatically pulls the long channel p-FET high enough to turn it on and shut off the gate of the large p-FET.

The cantilever diode chain shunts ESD charge because it turns on whenever the voltage on its input connection is suddenly raised. This is why it does not make a good input protection device to ground-it is like an ac short circuit to any changing signal (and thus may even help to attenuate switching noise). As a power supply clamp, the diode chain has no trigger voltage or overshoot problem, and should be fine as long as the Vcc startup transient is acceptable. Fortunately, ESD charge for the HBM is on the order of 100 pF×2000 V=0.2 μC, and for the CDM is even less, so the diode/PNP string conducts on the order of microcoulombs to serve as an effective ESD clamp. As 3.6 μC is $10^{-9}$ A-hr, or about $10^{-9}$ of a battery charge, the startup transient is of minor concern for product operation and probably is insignificant among the many other startup transients on a Vcc.

Cantilever diodes are connected from a single power supply to substrate and serve as a very effective power supply ESD clamp, having none of the triggering difficulties of TFO or SCR power supply clamps. With the single Vcc connection, there is no issue of adequate power supply isolation due to noise, power-up sequencing, or extremes of mixed supplies, and no attendant difficulties because of the PNP current gain. Indeed, the current gain is exploited fully and is essential to its operation. While the Webster effect ($\beta$ loss at high current) runs counter to desired conditions, there should usually be enough gain available from a multi-stage PNP chain to allow output base current to be supplied by a small circuit.

The history of semiconductor devices, and of electronics in general, is replete with cases of using the available gain to solve any and all problems. This Darlington coupled series of PNP transistors is a gain block, but it would perform poorly as any kind of traditional amplifier, and as such has not been a common sight in chip design. But, because of its current gain, it is beginning to help solve a major ESD protection problem, that of multiple power supply clamping. Because of their "stand-alone" status and ease of application, cantilever diodes could become the most important power supply ESD clamp in the processes for which they can be designed.

Methods for Enhancing β

Figure 24:
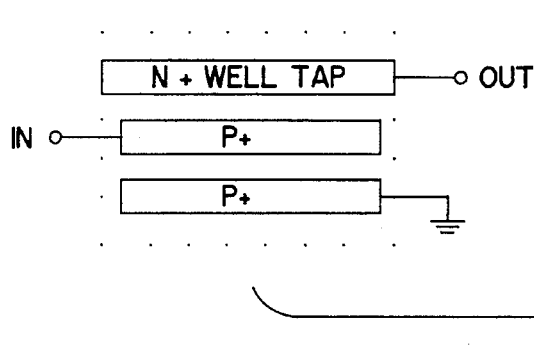
FIG. 24 shows a PPN cell layout, allowing topside current collection for β enhancement.
Figure 24:
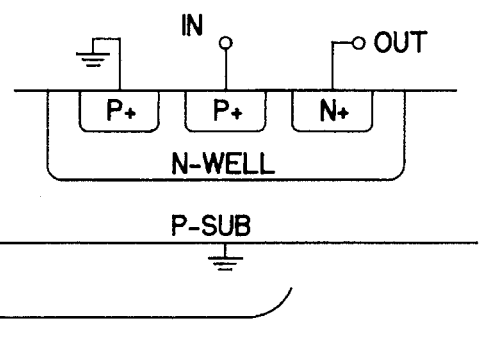

The description above shows how desirable it is to design cantilever diodes in as many processes as possible. But the cantilever diode chain requires a certain amount of PNP current gain, or β, which may not automatically appear in every process at high currents. As it has been established that β is useful, it could well be worthwhile to it in a design. As usual, any device advantage which can be gained with layout, while considering the process to be frozen, is legitimate. A clear approach to this is shown in FIG. 24, where the basic diode subcell has been modified to PPN style, to allow lateral current collection as well as vertical current collection.

The narrow base width in the topside PNP could also allow steady-state β to be achieved more quickly. However, in one process, a 30% area penalty achieved a 10% improvement in β. The time-dependent behavior was not studied thoroughly, but that payoff is not expected to be great, either. While it was not apparent in that one process, there is some risk in a PPN structure that when the current flows into a topside collector it will suffer damage due to overheating, because of the smaller area than the backside collector. Because of the voltage drop, much more heat will be dissipated at a reverse-biased collector-base junction than at a forward-biased emitter-base junction.

Figure 25:
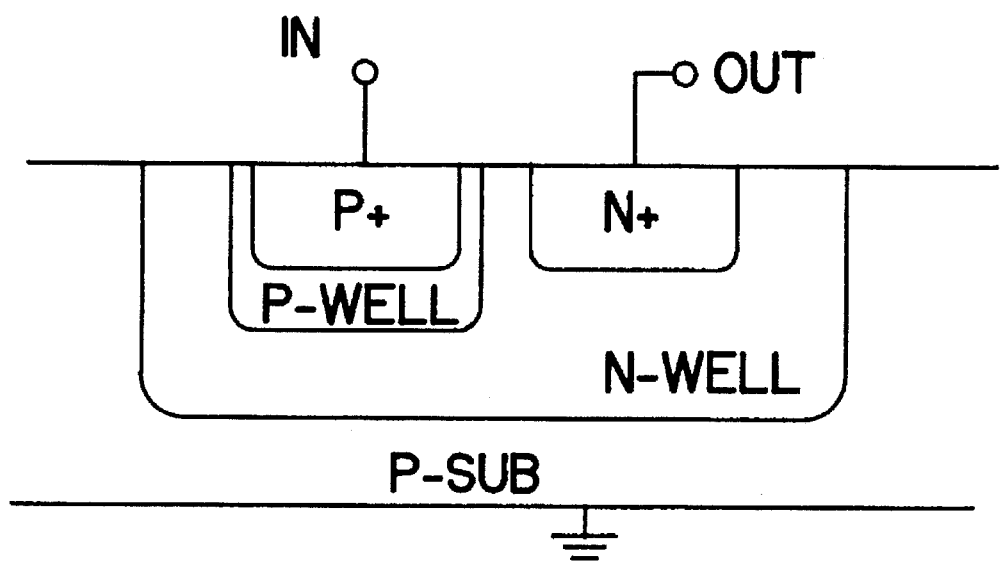
FIG. 25 illustrates use of p-well implant inside n-well in an attempt to enhance vertical β.

Another way to increase β is to make use of the p-well implant into the p-epi, now commonly done on CMOS processes using p-epi and a p$^+$ substrate. This implant ends up shallower than the n-well, and if (unconventionally) placed in an n-well, will counterdope it. Thus the p$^+$ junctions in the conventional diode structure, or PPN structure, can be deepened with the p-well implant, allowing a narrower base (FIG. 25). The effect on emitter efficiency, series resistance, and layout area may outweigh any advantages, however, so the whole concept remains speculative until proven out by measurements.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiment are not intended to limit the scope of the claims which themselves recite only those features regarded as essential to the invention.

What is claimed is:

1. A device for protecting an integrated circuit having an input/output buffer against electrostatic discharge, said input/output buffer including a first diode (22) having its anode coupled to a pad of said integrated circuit and its cathode coupled to a first peripheral supply potential, a second diode (24) having its anode coupled to an input node of said integrated circuit and its cathode coupled to a first internal supply potential, a third diode (23) having its anode coupled to a second internal supply potential and its cathode coupled to said input node, a fourth diode (25) having its anode coupled to said second internal supply potential and its cathode coupled to a second peripheral supply potential, and a resistance (37) connected between said pad and said input node of said integrated circuit, said protection device comprising:

a biased diode string (26) operating as a diode clamp to provide noise isolation between said first peripheral supply potential and said first internal supply potential, said biased diode string having an anode coupled to said first peripheral supply potential and its cathode coupled to said first internal supply potential.

2. The protection device defined by claim 1 wherein said biased diode string (26) utilizes a set of biasing resistances and a corresponding set of at least two series connected diodes, each biasing resistance coupled in parallel to one of said corresponding sets of at least two series connected diodes.

3. The protection device defined by claim 2 wherein there is an equipartition of voltage through each said set of at least two series connected diodes in the biased diode string.

4. The protection device defined by claim 3 wherein the resistance for each set of at least two series connected diodes is defined by the sequence:

$$\frac{R}{n-1}, \frac{R}{n-2}, \frac{R}{n-3}, \ldots, \frac{R}{3}, \frac{R}{2}, R$$

starting from the positive end of the string.

5. The device defined by claim 3 wherein a buffered voltage divider is used to provide equipartition of voltage through each of said sets of at least two series connected diodes.

6. The device defined by claim 5 wherein the buffered voltage divider operates to supply extra bias current to the middle of said diode chain.

7. The device defined by claim 5 wherein the buffered voltage divider comprises a leaker pair of transistors and a source follower transistor to supply said extra bias current only when needed.

8. The protection device defined by claim 1 wherein said biased diode string is tapered so that the p+ finger length of each succeeding stage is less than or equal to the p+ finger length of its preceding stage and so that the p+ finger length of at least one of said stages is less than the p+ finger length of at least one of said preceding stages.

9. The device defined by claim 8 wherein the p+ finger length of each succeeding stage which has a p+ finger length less than its preceding stages shrinks by a predetermined factor.

10. The device defined by claim 9 wherein the predetermined factor is determined by device modeling taking into account current dependent PNP β and device resistance for the electrostatic discharge test regime and desired leakage behavior over temperature for the device's operation regime.

11. A device for protecting an integrated circuit having a power supply protected against electrostatic discharge, said power supply including a first diode (22) having its anode coupled to a pad of said integrated circuit and its cathode coupled to a first peripheral supply potential, a second diode (26) having its anode coupled to said first peripheral supply potential and its cathode coupled to a first internal supply potential, said protection device comprising:

a cantilevered diode string (30) operating as a power supply electrostatic discharge clamp, said cantilevered diode string having an anode coupled to said first internal supply potential and a cathode coupled to a second internal supply potential.

12. The protection device defined by claim 11 wherein the cantilevered diode string utilizes a capacitor as a power supply anchorage.

13. The protection device defined by claim 11 wherein said cantilevered diode string (30) utilizes a set of biasing resistances and a corresponding set of series connected diodes, each biasing resistance coupled in parallel to a corresponding diode set.

14. The protection device defined by claim 13 wherein during steady state, substantially the same voltage is reached in each said diode set in the cantilevered diode string.

15. The protection device defined by claim 14 wherein the resistance for each diode pair is defined by the sequence:

$$\frac{R}{n-1}, \frac{R}{n-2}, \frac{R}{n-3}, \ldots, \frac{R}{3}, \frac{R}{2}, R$$

starting from the positive end of the string.

16. The protection device defined by claim 11 wherein said cantilevered diode string is tapered so that the p+ finger length of each succeeding stage is less than or equal to the p+ finger length of its preceding stage and so that the p+ finger length of at least one of said stages is less than the p+ finger length of at least one of said preceding stages.

17. The protection device defined by claim 16 wherein the p+ finger length of each succeeding stage shrinks by a predetermined factor.

18. The protection device defined by claim 17 wherein the predetermined factor is determined by device modeling taking into account current dependent PNP $\beta$ and device resistance for the electrostatic discharge test regime and desired leakage behavior over temperature for the device's operation regime.

19. The protection device defined by claim 11 wherein the cantilevered diode string utilizes a transistor network as a power supply anchorage.

20. The protection device defined by claim 19 wherein the transistor network comprises n-channel devices.

21. The protection device defined by claim 19 wherein the transistor network comprises a two stage RC delay circuit.

22. The protection device defined by claim 19 wherein the transistor network comprises:

a) a first p-FET device whose gate is coupled to a capacitance, whose source and drain are coupled between the output end of said cantilevered diode string and Vss;

b) a second p-FET device coupled between a node formed by said capacitance and the gate of said first device and, said second p-FET device adapted to provide a resistance so as to provide an RC time constant of at least one microsecond;

c) a third p-FET device whose source and drain are coupled between the output end of said cantilevered diode string and Vccx, said third p-FET device adapted to provide a predetermined leakage current to the output end of said cantilevered diode string;

d) a n-FET device whose source and drain are coupled between the gates of said second and third p-FET devices and Vss, wherein after said RC induce time delay, said first p-FET device turns off and said second p-FET device operates to assure that the voltage of said capacitance is less than or equal to the voltage input to said diode string.

23. The protection device defined by claim 22 wherein the capacitance comprises at least two series connected capacitors.

* * * * *